United States Patent [19]

Kanai

[11] 4,274,004
[45] Jun. 16, 1981

[54] ION IMPLANTER

[75] Inventor: Norio Kanai, Chofu, Japan

[73] Assignee: Hitachi, Ltd., Tokyo, Japan

[21] Appl. No.: 112,818

[22] Filed: Jan. 17, 1980

[30] Foreign Application Priority Data

Feb. 2, 1979 [JP] Japan .................................. 54-10377

[51] Int. Cl.$^3$ ............................................. G21K 5/10
[52] U.S. Cl. ................................ 250/442; 250/492 B; 250/521
[58] Field of Search .................... 250/442, 492 B, 311, 250/521, 444

[56] References Cited

U.S. PATENT DOCUMENTS

| | | | |
|---|---|---|---|
| 3,727,051 | 4/1973 | Stockbridge | 250/311 |
| 3,745,341 | 7/1973 | Sakitani | 250/311 |
| 3,778,621 | 12/1973 | Mikajiri | 250/442 |
| 3,823,321 | 7/1974 | Rauch | 250/311 |

*Primary Examiner*—Harold A. Dixon
*Attorney, Agent, or Firm*—Craig and Antonelli

[57] ABSTRACT

The present invention relates to an ion implanter which is so constructed that specimens placed in the specimen chamber are caused to move so that ions supplied from an ion source are homogeneously implanted into the surfaces of the specimens, wherein said specimen chamber is so constructed that the whole mechanism which transmits the motion for moving the specimens is surrounded by space which is different from space which includes the specimens.

14 Claims, 3 Drawing Figures

ION IMPLANTER

BACKGROUND OF THE INVENTION

The present invention relates to an ion implanter, and more specifically to an ion implanter having an improved specimen chamber.

The manufacture of semiconductur elements includes a step for homogeneously introducing impurities into a wafer, and the introduction of impurities is carried out by, for example, an ion implantation method which is performed under highly-evacuated conditions.

If electrical scanning by an ion beam such as used for the conventional low-current ion implanter is applied to a high-current ion implanter to effect the above-mentioned ion implantation, the secondary electrons for neutralizing the ion space charged which prevents the divergence of the ion beam are absorbed by the deflecting electrodes which are used for the electrical scanning. Therefore, the ion beam diverges due to its own space charge, and makes it difficult to perform the scanning. For the above-mentioned reasons, high-current ion implantation is usually carried out by holding the ion beam stationary and mechanically scanning the wafer in two dimensions to homogeneously implant ions.

FIG. 1 illustrates a rotary disc system employed for mechanically scanning specimens 2 in the form of wafers and the like mounted on the surface of a disc 1 which is moved in rectilinear fashion in one direction while it is being rotated. This arrangement, howevere, presents the following problems:

(1) It is difficult to introduce the rotating and rectilinearly-moving disc from the open air into a vacuum chamber while maintaining an air-tight seal.

(2) It is difficult to lubricate the mechanical portions for transmitting motion to the disc or to lubricate the straight guide portions thereof.

(3) For the reason mentioned in (2) above, it is difficult to smoothly transmit and guide the motion to the disc.

(4) For the reason mentioned in (2) above, the engaging and sliding portions tend to become worn to a marked extent, and the wafer surfaces and vacuum chamber are contaminated by the dust of abrasion resulting from such wear.

(5) For the reasons mentioned in (2) to (4) above, it is very difficult to maintain precision of operation and to perform maintenance on the system.

SUMMARY OF THE INVENTION

In view of the above-mentioned problems, the object of the present invention is to provide an ion implanter in which the motion transmission mechanism for moving specimens, such as wafers, is wholly surrounded by a space which is stretchably communicated with the open air, in order to prevent the surfaces of specimens and the vacuum chamber from being contaminated, the ion implanter being equipped with a specimen chamber which is capable of easily establishing a high degree of vacuum.

In order to achieve the above-mentioned object, the present invention deals with an ion implanter comprising an ion source, a specimen chamber in communication with the ion source, a mechanism which is accommodated in the specimen chamber and which transmits both rotational and rectilinear motion causing the specimens to move so that ions supplied from the ion source are homogeneously implanted into the surfaces of the specimens placed in the specimen chamber, and vacuum exhaust means for evacuating the specimen chamber, wherein the motion transmission mechanism in the specimen chamber is enclosed in a space which is different from the space which accommodates the specimens.

DETAILED DESCRIPTION OF THE PREFERRED EMBODIMENT

The invention is described below with reference to an exemplary embodiment.

Figure 1:
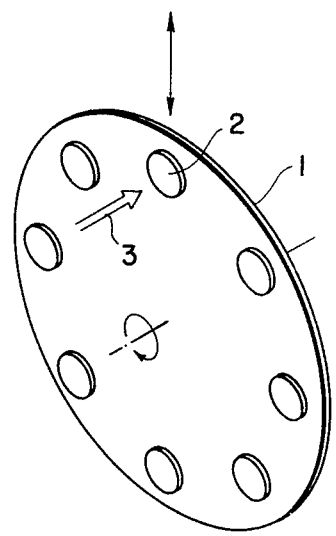
FIG. 1 is a diagram illustrating a rotary disc system employed for an ion implanter.
Figure 2:
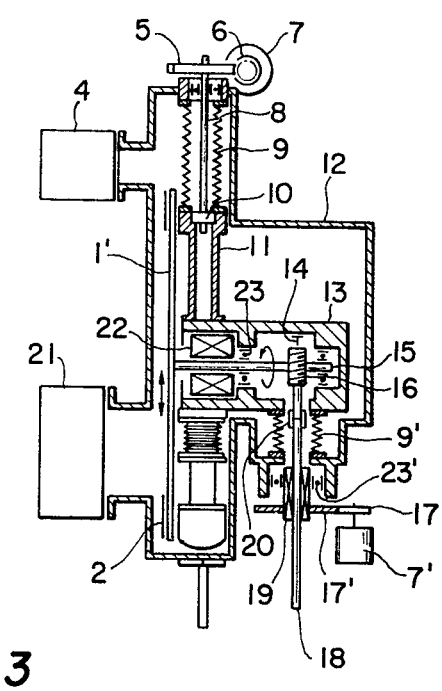
FIG. 2 is a vertical cross-sectional view illustrating a portion of a specimen chamber according to the present invention.
Figure 3:
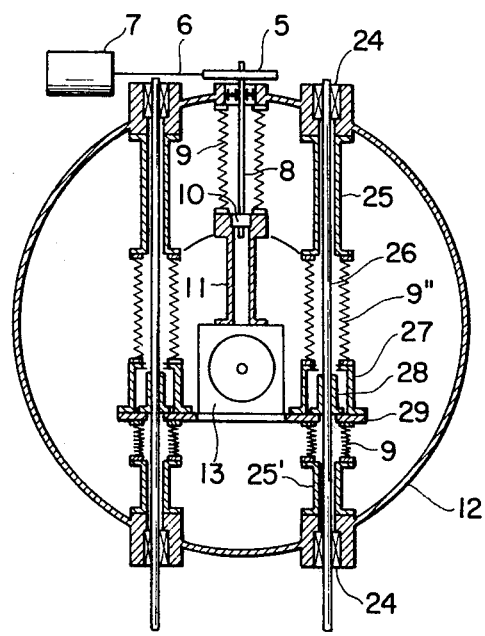
FIG. 3 is a lateral cross-sectional view schematically illustrating the specimen chamber.

FIG. 2 is a cross-sectional view illustrating an embodiment for introducing a drive system which rotates disc mounting wafers, according to the present invention, and FIG. 3 is a cross-sectional view illustrating a drive system and a guide portion for moving the disc up and down according to the embodiment of the present invention.

Specimens (wafers and the like) 2 are arrayed on the circumference of a disc 1', which is rotated and at the same time moved rectilinearly in the direction of the arrow A in a specimen chamber 12 having vacuum-exhausting means 21, such that ions generated by an ion source 4 are implanted into the surfaces of wafers 2.

The drive system for rotating the disc 1' will be first described with reference to FIG. 2. The disc 1' is coupled to a shaft 15, which is supported in a box 13 via a pair of bearings 23. The gap between the shaft 15 and the box 13 is hermetically sealed by a magnetic fluid seal 22. A gear 14 coupled to the shaft 15 meshes with a worm 16 coupled via a joint 20 to a spline shaft 18 which penetrates through a spline nut 19 supported in the wall of the specimen chamber 12 via bearings 23'. Furthermore, a gear 17' is coupled to the outer periphery of the spline nut 19, and is further connected to a motor 7' via a gear 17. A port for introducing the worm 16 formed in the box 13 is connected hermetically by bellows 9' to a port for introducing spline shaft 18 formed in the specimen chamber 12, and the interior of the box 13 located in the specimen chamber 12 is in communicatin with the open air. As mentioned above, rotation of the motor 7' is transmitted up to the disc 1' entirely through the open air. The bellows 9' retractably expands, and the spline shaft 18 moves in the spline nut 19 responsive to the rectilinear motion of the box 13, which imparts rectilinear motion to the disc 1', as will be described with reference to FIG. 3.

As seen in FIG. 3, two spline shafts 26 extend through the wall of the specimen chamber 12 from the outer side thereof, arrayed in parallel on both sides of the box 13, and are connected to a plate 29 via posts 28 having holes through which the spline shafts 26 penetrate. The box 13 supporting the shaft 15 of the disc 1' is secured to the plate 29 so as to move as a unit with the plate 29 and spline shafts 26. The spline shafts 26 are supported by nuts 24 of two pairs of splines fastened to the wall of the specimen chamber 12, so that they move rectilinearly in the specimen chamber 12.

Furthermore, the two pairs of opposing ports in the nuts 24 fastened to the wall of the specimen chamber 12 to introduce the spline shafts 26 are hermetically connected by means of pipes 25, 25' and 27 as well as bellows 9 and 9" with the plate 29 interposed therebetween. In this way, a vacuum can be maintained in chamber 12 without leakage through the ports in the walls thereof through which the spline shafts 26 extend.

A ball screw 8 is introduced from the outer side of the specimen chamber 12 through the outer wall thereof, and to one end of the ball screw 8 at the outer side of the specimen chamber 12 is fastened a gear 5 which is connected to a motor 7 via a gear 6. The ball screw 8 introduced into the specimen chamber 12 meshes with a nut 10 secured to a post 11 which is hermetically fastened to the box 13. The port in the wall of the specimen chamber 12 for introducing the ball screw 8 and the post 11 are hermetically connected via a bellows 9, so that the ball screw 8 is hermetically introduced. In other words, the ball screw 8 and the nut 10 mesh together in the open air. The ball screw 8 is rotated by the motor 7 via gears 5 and 6, and the nut 10 is caused to move in reciprocal fashion along the ball screw 8. At the same time, the box 13 or disc 1' moves together with the post 11 via the ball spline shafts 26 with the nuts 24 of ball splines as guides, while the bellows 9 and 9" expand and retract.

As described in detail in the foregoing, the drive system for rotating the disk 1', the drive system for moving the disc 1' up and down, and guide portions, all move in the open air.

As illustrated above, the specimen chamber employed for the ion implanter of the present invention has space in the specimen chamber that communicates with the open air, and can be very effectively utilized for performing machining, such as ion-beam milling and electron-beam milling, under vacuum conditions, and for carrying out analysis and observation. Accordingly, the specimen chamber of the present invention has the following advantages.

(1) Space for transmitting the motion communicated with the open air can be provided in the specimen chamber itself, enabling the motion to be transmitted in the open air.

(2) For the reason mentioned in (1) above, the mechanism for transmitting the motion and the rectilinear guide portions can be lubricated, so that the motion is smoothly transmitted.

(3) For the reason mentioned in (1) above, the lubricating agent or dust of abrasion in the motion transmitting portions are prevented from flying into the specimen chamber, so that the surfaces of the wafers and interior of the vacuum chamber are not contaminated.

(4) For the reason mentioned in (3) above, a high degree of vacuum can be easily obtained in the specimen chamber.

(5) For the reasons mentioned in (1) to (3) above, high precision can be maintained, and maintenance can be easily performed on the system.

According to the specimen chamber employed for the ion implanter of the present invention as mentioned in detail in the foregoing, the whole mechanism for transmitting the motion of disc mounting specimens, such as wafers, is surrounded by space which is expandably communicated with the open air, the moving portions can be lubricated, the surfaces of the specimens and interior of the vacuum chamber are prevented from being contaminated by the lubricating agent or dust of abrasion, and a high degree of vacuum is easily obtained. Furthermore, the present invention is not restricted only to the ion implanter of the embodiment mentioned above, but rather, the specimen chamber of the present invention can be suitably adapted to an apparatus which carries out machining, analysis, observation and the like under vacuum or particular atmospheric conditions, such as ion-beam milling, electron-beam milling, and the like.

While I have shown and described one embodiment in accordance with the present invention, it is to be understood that the same is not limited thereto but is susceptible of numerous changes and modifications as obvious to those of ordinary skill in the art, and I therefore do not wish to be limited to the details shown and described herein but intend to cover all such changes and modifications as are obvious to one of skill in the art.

What is claimed is:

1. An ion implanter comprising a specimen chamber; a specimen carrier disposed within said specimen chamber; an ion source positioned to direct an ion beam at said specimen carrier to bombard one or more specimen carried thereon; drive means for simultaneously imparting both rotational and rectilinear motion to said specimen carrier; vacuum exhausting means for evacuating said specimen chamber; and means within said specimen chamber for enclosing said drive means so as to completely isolate said drive means from the atmosphere of said specimen chamber.

2. An ion implanter according to claim 1, wherein said drive means includes a box disposed within said specimen chamber, a drive shaft secured to said specimen carrier and extending into said box, bearing means within said box for rotatably supporting said drive shaft, and motor means for rotating said drive shaft while reciprocating said box along a rectilinear path.

3. An ion implanter according to claim 2, wherein said motor means includes a spline shaft extending through the walls of said specimen chamber and said box, gear means for drivingly connecting said spline shaft to said drive shaft, and a motor in driving engagement with said spline shaft.

4. An ion implanter according to claim 3, wherein said enclosing means includes a bellows secured between said box and said specimen chamber and in surrounding relationship to said spline shaft.

5. An ion implanter according to claims 3 or 4, wherein said enclosing means includes a magnetic fluid seal disposed in the opening in said box through which said drive shaft extends.

6. An ion implanter according to claim 2, wherein said motor means includes a ball screw extending through the wall of said specimen chamber, a nut secured to said box and engaging said ball screw and a motor in driving engagement with said ball screw.

7. An ion implanter according to claim 6, wherein said enclosing means includes a bellows secured between said nut and said specimen chamber in surrounding relationship to said ball screw.

8. An ion implanter according to claim 7, further including a hollow post secured to said box at one end thereof and having said nut secured to the other end thereof so that said ball shaft is axially aligned with said post, said bellows being secured between the inner wall of said specimen chamber and the end of said post to which said nut is secured.

9. An ion implanter according to claims 1, 2 or 6, further including guide means within said specimen chamber for guiding said specimen carrier in its rectilinear movement, said enclosing means also completely isolating said guide means from the atmosphere of said specimen chamber.

10. An ion implanter according to claim 6, further including at least one guide shaft supported within said specimen chamber, a post mounted on said shaft and means for securing said post to said box, said guide shaft being disposed in parallel with said ball screw so that movement of said box by said ball screw is restricted to a direction parallel to the axis of said guide shaft.

11. An ion implanter according to claim 10, wherein said guide shaft extends at both ends through the walls of said specimen chamber and is supported thereat for axial movement, said post being secured to said guide shaft for movement therewith, and wherein said enclosing means includes bellows secured between said means for securing said post to said box and the wall of said specimen chamber in surrounding relationship to said guide shaft.

12. An ion implanter according to claims 6, 8, 10 or 11, wherein said motor means includes a spline shaft extending through the walls of said specimen chamber and said box, gear means for drivingly connecting said spline shaft to said drive shaft, and a motor in driving engagement with said spline shaft.

13. An ion implanter according to claims 6, 10 or 11, further including a hollow post secured to said box at one end thereof so that said ball shaft is axially aligned with said post, said bellows being secured between the inner wall of said specimen chamber and the end of said post to which said nut is secured.

14. An ion implanter according to claims 2, 3 or 6, wherein said specimen carrier is a disc with said drive shaft secured to the center thereof.

* * * * *